United States Patent
Nikonov et al.

(10) Patent No.: US 8,933,521 B2
(45) Date of Patent: Jan. 13, 2015

(54) THREE-DIMENSIONAL MAGNETIC CIRCUITS INCLUDING MAGNETIC CONNECTORS

(75) Inventors: Dmitri E. Nikonov, Morgan Hill, CA (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 938 days.

(21) Appl. No.: 13/075,690

(22) Filed: Mar. 30, 2011

(65) Prior Publication Data

US 2012/0248556 A1  Oct. 4, 2012

(51) Int. Cl.
*H01L 29/82* (2006.01)
*H01L 27/22* (2006.01)
*H01L 43/08* (2006.01)

(52) U.S. Cl.
CPC ............ *H01L 27/22* (2013.01); *H01L 43/08* (2013.01)
USPC ............ 257/421; 257/E21.002; 257/E29.323; 438/3

(58) Field of Classification Search
USPC ................ 257/421, E21.002, E29.323; 438/3
See application file for complete search history.

(56) References Cited

U.S. PATENT DOCUMENTS

| | | |
|---|---|---|
| 7,855,911 B2 | 12/2010 | Lou et al. |
| 2009/0146233 A1 | 6/2009 | Hall et al. |
| 2011/0037463 A1 | 2/2011 | Bertacco et al. |

FOREIGN PATENT DOCUMENTS

| | | |
|---|---|---|
| JP | 2011-047928 | 3/2011 |
| KR | 10-2004-0094598 | 11/2004 |

OTHER PUBLICATIONS

Braganca et al. "A Three-Terminal Approach to Developing Spin-Torque Written Magnetic Random Access Memory Cells," IEEE Transactions on Nanotechnology, vol. 8, No. 2, Mar. 2009, 6 pages.
Hosomi et al., "A Novel Nonvolatile Memory with Spin Torque Transfer Magnetization Switching: Spin-RAM," IEEE Dec. 2005, pp. 459-462. Abstract only.
Kishi et al., "Lower-current and Fast Switching of a Perpendicular TMR for High Speed and High Density Spin-Transfer-Torque MRAM," IEEE Explore, Dec. 2008, 4 pages. Abstract only.
Mangin et al., "Current-Induced Magnetization Reversal in Nanopillars With Perpendicular Anisotropy," Nature Materials, vol. 5, Mar. 2006, 6 pages.
Matsunaga et al., "Fabrication of a Nonvolatile Full Adder Based on Logic-in-Memory Architecture Using Magnetic Tunnel Junctions," Applied Physics Express 1, 2008, 3 pages.
Yoshikawa et al., "Tunnel Magnetoresistance Over 100% in MgO-Based Magnetic Tunnel Junction Films With Perpendicular Magnetic L1/0 FePt Electrodes," IEEE Transactions on Magnetics, vol. 44, No. 11, Nov. 2008, pp. 2573-2576. Abstract only.
Yuasa et al., "Giant room-temperature magnetoresistance in single-crystal Fe/MgO/Fe magnetic tunnel junctions," Nature Materials, vol. 3, Dec. 2004, 4 pages.
Nikonov et al., "Proposal of a spin torque majority gate logic", Jun. 23, 2010, 14 pages.

(Continued)

*Primary Examiner* — Marvin Payen
(74) *Attorney, Agent, or Firm* — Trop, Pruner & Hu, P.C.

(57) ABSTRACT

A device including at least two spintronic devices and a method of making the same. A magnetic connector extends between the two spintronic devices to conduct a magnetization between the two. The magnetic connector may further be disposed to conduct current to switch a magnetization of one of the two spintronic devices.

18 Claims, 15 Drawing Sheets

(56) References Cited

OTHER PUBLICATIONS

Kiselev et al., "Microwave Oscillations of a Nanomagnet Driven by a Spin-Polarized Current", Nature, Sep. 25, 2003, pp. 380-383.

International Searching Authority, "Notification of Transmittal of the International Search Report and the Written Opinion of the International Searching Authority," mailed Jul. 11, 2012, in International application No. PCT/US2011/066791.

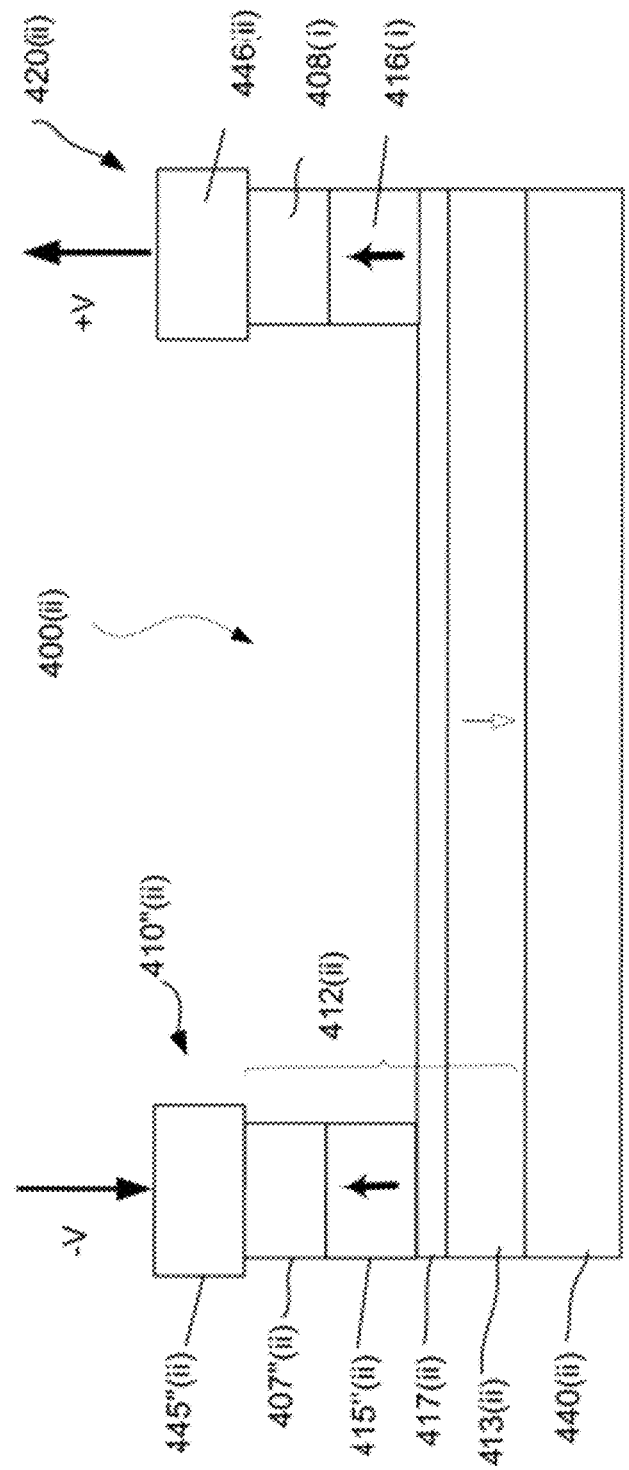

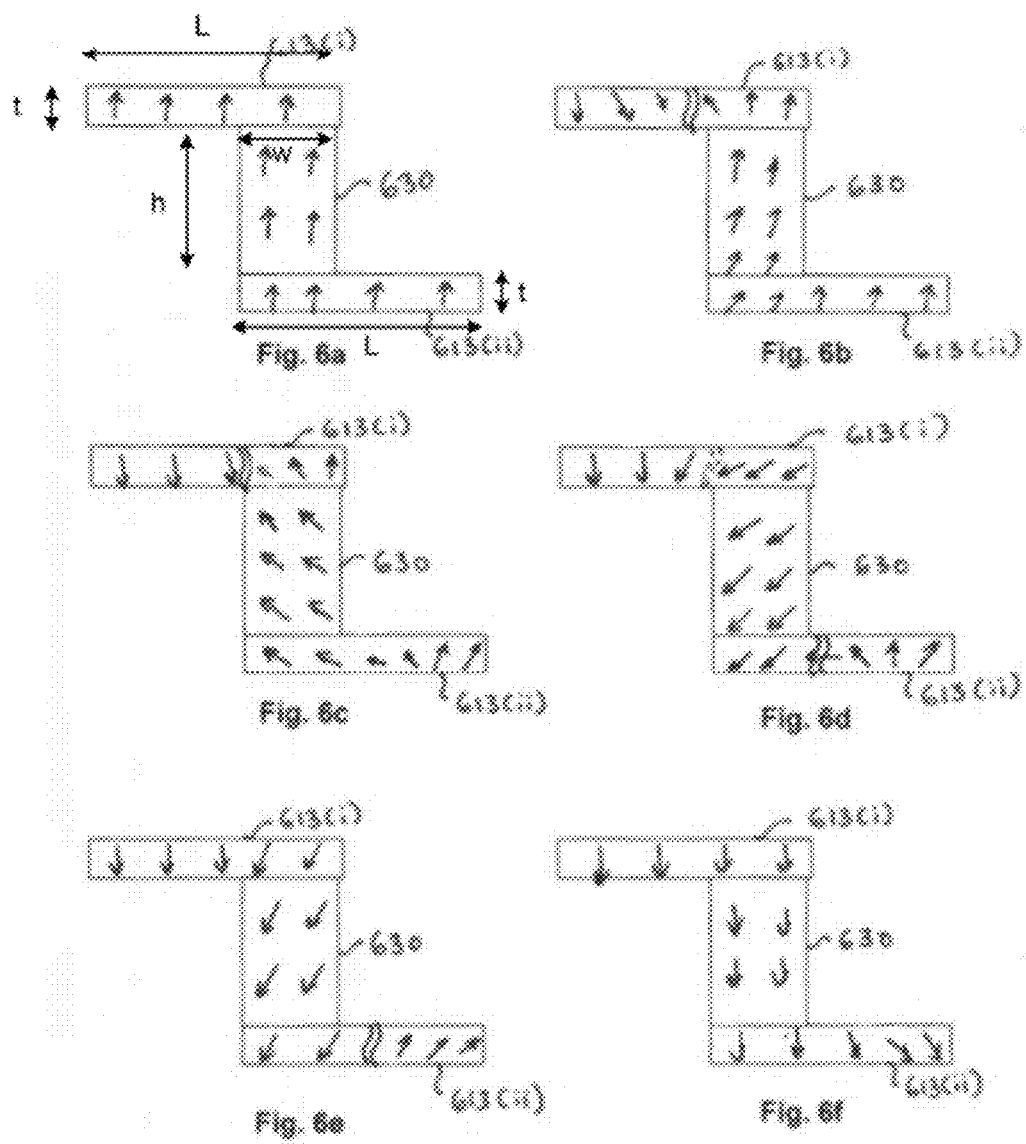

US 8,933,521 B2

THREE-DIMENSIONAL MAGNETIC CIRCUITS INCLUDING MAGNETIC CONNECTORS

BACKGROUND

Magnetic circuits that include ferromagnetic (FM) wires have allowed the fabrication of spintronic devices, that is, devices that are adapted to make use of an interaction between a current of spin-polarized electrons and a magnetic field to fulfill their prescribed functions, such as for example, the function of serving as non-volatile memory devices or as reconfiguration logic devices. The internal computational state in magnetic devices is encoded by the magnetization direction, such that, even where power is removed from the magnetic circuit in question, the magnetization direction may remain, potentially for tens of years. Spintronic devices have been known to be formed including metal layers of an integrated circuit as their electrodes.

In order to provide a three-dimensional configuration of logic devices, the prior art still uses CMOS structures built up on a semiconductor device layer supported by a wafer, and bonds different such wafers together to achieve the three-dimensional structure. However, wafer-bonding is an expensive process, and offers only a limited number of bonded connections.

BRIEF DESCRIPTION OF THE DRAWINGS

Some embodiments of the invention may be better understood by referring to the following description and accompanying drawings that are used to illustrate embodiments of the invention. In the drawings:

FIGS. 1b and 1c are cross sectional views of the device of FIG. 1a;

FIG. 2b is a cross-sectional view along lines B-B of FIG. 2a;

FIGS. 4b-4d are cross-sectional views of the circuit of FIG. 4a;

FIGS. 5b-5d are cross-sectional views of the circuit of FIG. 5a;

FIGS. 6a-6f are cross-sectional views of a magnetic connector and respective common free FM layers in the process of undergoing a switch in magnetization direction as rendered by simulation;

DETAILED DESCRIPTION

Figure 1A:
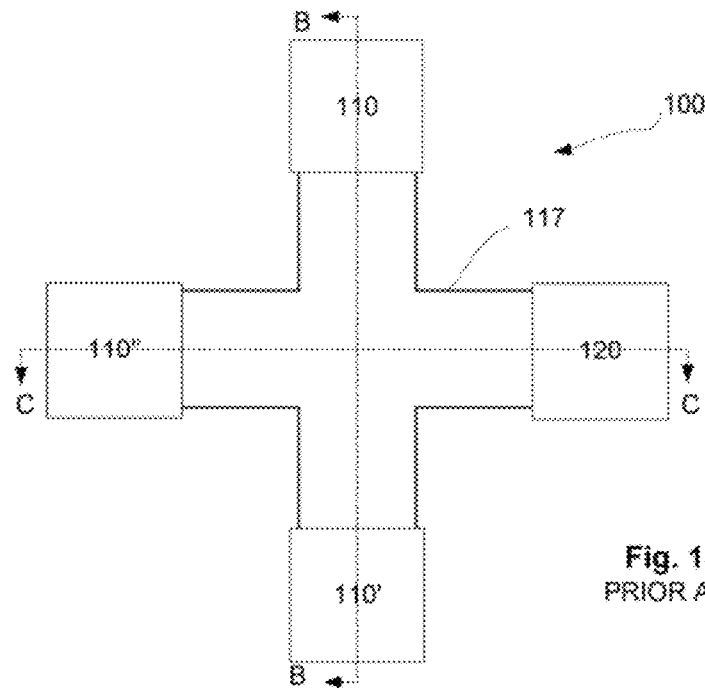
FIG. 1a is a top plan view of a prior art spin torque majority gate (STMG) device, with the insulation layers and non-magnetic layers having been removed.

In the following description, numerous specific details are set forth. However, it is understood that embodiments of the invention may be practiced without these specific details. In other instances, well-known circuits, structures and techniques have not been shown in detail in order not to obscure an understanding of this description.

In the instant description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

Figure 1B:
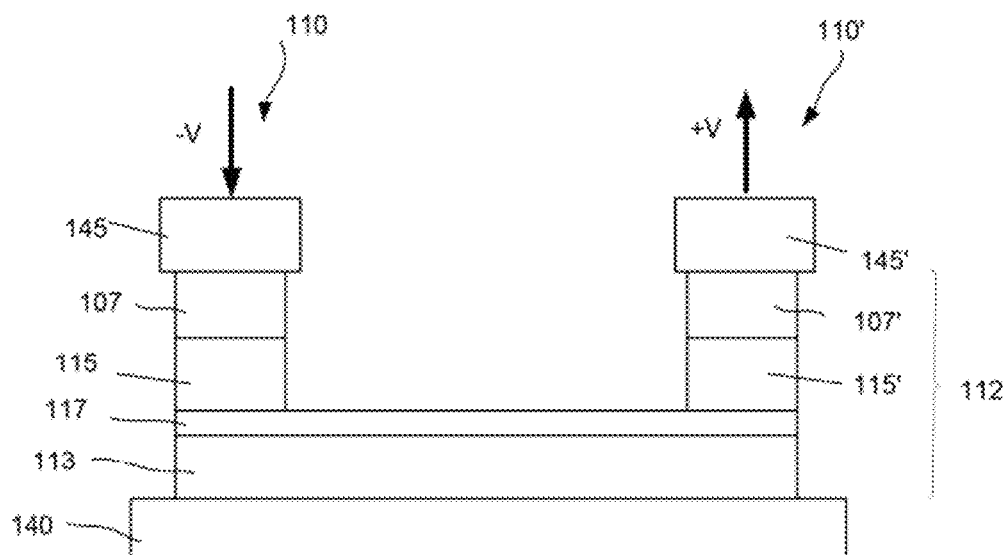

Spintronic devices formed between metal layers of an integrated circuit are known, and an example of the same is shown in FIGS. 1a-1b in the form of a spin torque device. It is noted that although embodiments as described and depicted herein pertain to a spin torque device, and in particular to a spin torque majority gate (STMG) as will be described, embodiments are by no means so limited, but rather include within their scope the use of any spintronic device, whether a logic device, a memory device or a spin oscillator, or other spintronic devices, as would be recognized by one skilled in the art.

Figure 1C:
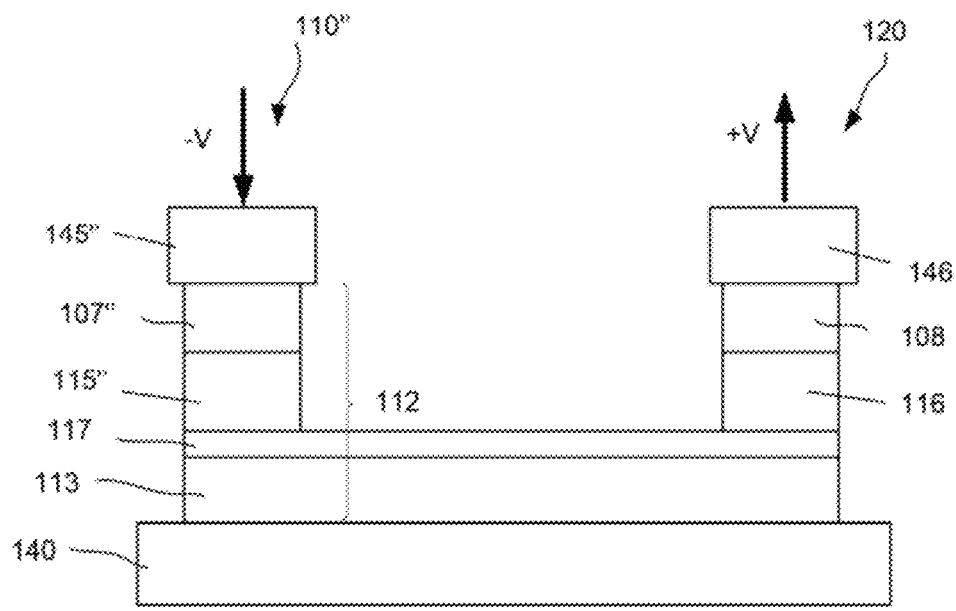

Referring now to FIGS. 1a-1c, the spin torque device shown, known as an STMG 100 of FIGS. 1a, 1b and 1c, has three input pillars (or nanopillars) 110, 110' and 110", and one output pillar 120 electrically isolated from each other, each pillar including its own fixed FM layer 115, 115', 115" and 116, respectively, and its own pinning anti-FM layer 107, 107', 107" and 108, respectively (FIGS. 1a and 1b). FIG. 1b is a cross section of FIG. 1a along lines B-B, and FIG. 1c is a cross-section of lines C-C along lines C-C. Nanopillars 110 and 110', 110" and 120 are disposed on a free cross-shaped common FM layer 113 coextensive with a non-magnetic (NM) layer 117. The layers including the fixed FM layer, the anti-FM layer, the NM layer and the common free FM layer will be called the magnetic stack 112 hereinafter. Magnetic stack 112 is sandwiched between a common electrode 140, and four electrodes 145, 145' 145" and 146, one for each respective pillar. A current at each of the inputs exerts spin torque on the magnetization of the common free layer 113 and attempts to switch it (that is, switch its magnetization direction). The magnetization of the common free layer 113 is switched by spin torque to a state determined by the majority (at least 2 of the 3) input pillars. The device is shown with perpendicular magnetization of the FM layers. Thus, as seen in FIG. 1b, the stable equilibrium states of the device corresponding to logical "0" and "1" are magnetization directions up and down, that is, out of the plane or into the plane of the IC. A STMG is predicated on the well-known principle that a spin-polarized electrical current can apply a torque to a ferromagnet through direct transfer of spin angular momentum. Thus, a magnetic multilayer structure may convert energy for example from a direct electrical current into switching a magnetization direction of a device.

The FM layers 113 and 115 may include any FM material, such as, for example, cobalt, a cobalt-iron alloy, or nickel-iron alloy, a cobalt-nickel alloy, or iron-platinum alloy. The FM layers 113 and 115 can be a multi-layer combination of several alloys. The non-magnetization layer 117 may for example include a non-magnetic metal such as copper. Alternatively, the non-magnetization layer 117 may for example include a dielectric/non-magnetic material, such as aluminum oxide ($Al_2O_3$) or magnesium oxide (MgO). A pinning anti-ferromagnetic layer (AFM layer) 107 is disposed such that the fixed FM layer is sandwiched between it and the non-magnetization layer. The role of the pinning AFM layer is to prevent the fixed FM layers from undergoing rotation as a result of spin transfer torque. The AFM layer may comprise any exchange material such as, for example, iron-manganese alloy or a platinum-manganese alloy. The electrodes may be made of any non-magnetic conductive material for example, such as copper or gold. For example, the free FM layer may include a layer of Co having a thickness ranging from about 2 to about 4 nm; the non-magnetization layer may include a layer of MgO having a thickness ranging from about 0.8 to about 1.2 nm; the fixed FM layer may include a layer of Co having a thickness ranging from about 2 to about 4 nm; and the pinning layer may include a layer of PtMn having a thickness from about 10 to about 30 nm, embodiments of course not being so limited. Transmission of electrons by way of direct current by virtue of a voltage applied across material stack 112 drives the electrons through the fixed FM layer 115 toward the non-magnetization layer, applying a torque to the free FM layer 113. Magnetization of the free FM layer is switched by spin torque determined by the current passed through the material stack 112.

Figure 2A:
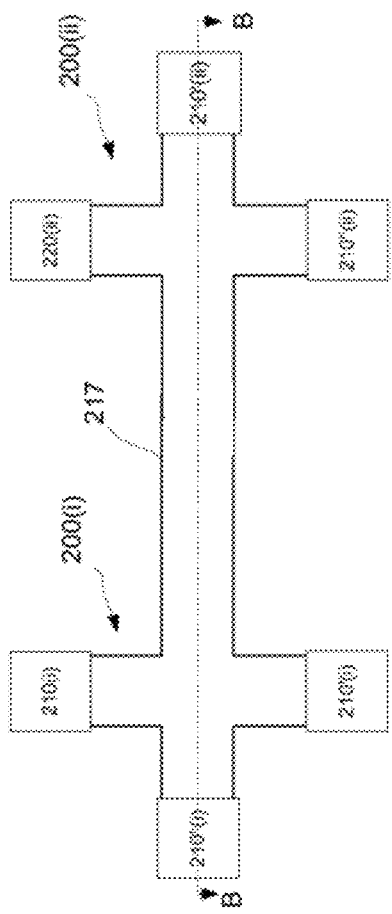
FIG. 2a is a top plan view similar to FIG. 1a of a prior art circuit including two laterally magnetically coupled STMG devices.
Figure 2B:
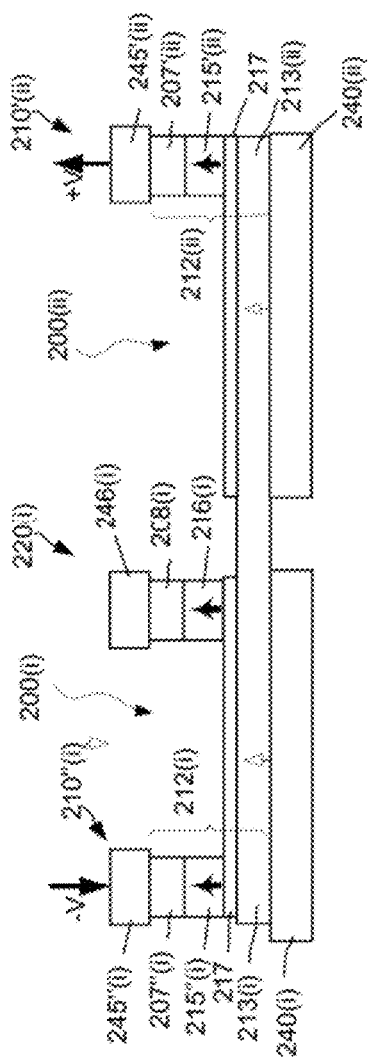

Referring first to FIGS. 2a-2b, a top plan view and cross-sectional views of a prior art magnetic circuit is shown including two STMG devices with the insulation layers not being shown for the sake of simplicity, the two STMG devices having been magnetically coupled by way of a lateral extension of a free FM layer common as between the two STMG devices. FIG. 2b is a cross-section of FIG. 2a along line B-B. In the shown example, a first STMG device 200(i) is connected by way of free common FM layer 213(i)/(ii) to a second STMG device 200(ii), the two devices 200(i) and 200(ii) being disposed between the same two metal lines. The STMG devices 200(i) and 200(ii) are similar to STMG device 100 of FIGS. 1a-1c described previously. Thus, like reference numerals as between FIGS. 1a-1c on the one hand, and FIGS. 2a-2b on the other hand, are meant to refer to like components for each STMG device, and will therefore not be described further. Thus, reference numerals 110, 110', 110", 107", 108, 112, 113, 115", 116, 117, 120, 140, 145" and 146 refer to parts in FIGS. 1a-1c of STMG device 100 that are respectively structurally similar to parts in FIGS. 2a-2b referred to as 210, 210'(i), 210"(i), 207"(i), 208(i), 212(i), 213(i), 215"(i), 216(i) 217, 220(i) 240(i), 245"(i) and 246(i) for STMG device 200 (i). In addition, references numerals 110', 110", 107', 112, 113, 115', 117, 120, 140, 145' refer to parts in FIGS. 1a-1c of STMG device 100 that are respectively structurally similar to parts in FIGS. 2a-2b referred to as 210'(ii), 210"(ii), 207'(ii), 213(ii), 215'(ii), 217(ii), 220(ii), 240(ii), 245'(ii) for STMG device 200(ii). Here, the magnetization of the free common FM layer 213(i) of STMG 200(i) is coupled to the free common FM layer 213(ii) of STMG 200(ii) by way of a lateral extension of one free common FM layer into another as shown. Thus, an output magnetization of STMG device 200 (i) is outputted to STMG device 200(ii) as an input thereof. As a result, STMG device 200(ii) is missing an input nanopillar (which would have been input nanopillar 210(ii)). As shown, STMG device 200(i) and 200(ii) are between the same two metal layers, in this exemplary case between metal layers M3 and M4 for example. The prior art circuit of FIGS. 2a-2b thus concatenates two STMG devices laterally.

Figure 3A:
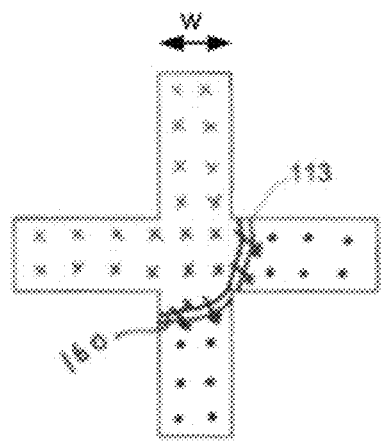
FIGS. 3a-3d are a top plan view of a common free FM layer of FIGS. 1a-1c in the process of undergoing a switch in magnetization direction as rendered by simulation.
Figure 3B:
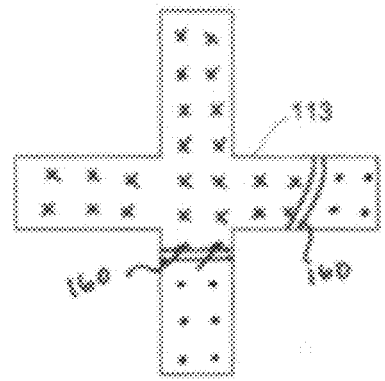
Figure 3C:
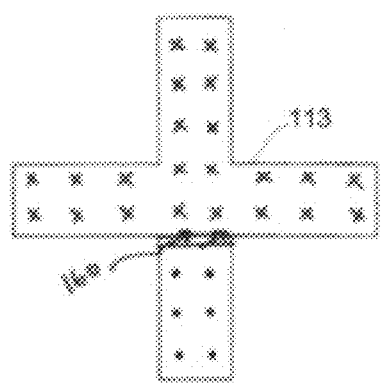
Figure 3D:
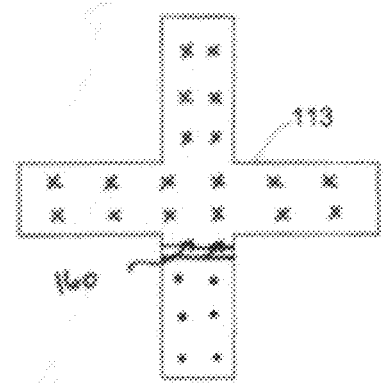

Referring to FIGS. 3a-3d, simulation results are shown in the form of successive images depicting the common free FM layer 113 of FIGS. 1a and 1b in top plan view. The simulation results were obtained for a common free FM layer 20 nm wide, 5 nm thick (the width dimension being shown as "w" in FIG. 3a), and the thickness dimension extended into the page, and a current of 10 mA at each of the input nanopillars. The snapshots in successive ones of FIGS. 3a-d were taken at time instants separated by 0.2 ns. As seen in FIG. 3a, the magnetization direction in the free FM layer 113 points down in the top and left arm, and down in the bottom and right arm, a domain wall 160 existing between the two magnetization directions. By virtue of the current inputs, the domain wall 160 moves such that the downward magnetization eventually completely takes over the right arm of the free FM layer, as seen in FIGS. 3b-3d.

Embodiments will now be described in relation to a first embodiment as depicted in FIGS. 4a-4d, where a magnetic connector passively connects two STMG devices, and a second embodiment as depicted in FIGS. 5a-5d, where a magnetic connector actively connects two STMG devices. The magnetic connector may include a pillar of a FM material connecting two planar FM layers on different metallization layers. The magnetic connector may cross through a metal line or metallization layer (for example, copper), although it does not need to be necessarily isolated from the metal line, since it shares a common potential with the same, and the non-magnetic material of the metal line will not affect magnetization in the connector. A purpose of the magnetic connector is to pass the signal or magnetization, that is, the wave of the magnetization direction, from a first spintronic device between a first two metal lines to a second spintronic device between a second two metal lines different from the first two metal lines to achieve a three-dimensional concatenation of spintronic devices. Although embodiments as depicted show the connector directing a magnetization output of a first spintronic device to a second logic device including metal lines disposed at a lower level than metal lines of the first spintronic device, embodiments are not so limited, and include within their scope the use of a connector between spintronic devices where the magnetization output from a lower metal level device is conducted to a higher level device. According to some embodiments, the magnetic connector could for example have an aspect ratio (i.e. connector height h divided by connector width w—see for example FIGS. 6a-6f) in a range from about 1/20 to about 1/10, although embodiments encompass magnetic connectors having other aspect ratios depending on application needs.

The embodiments of FIGS. 4a-4d and of FIGS. 5a-5d may include nanopillars having similar material layers for example to the nanopillar shown in FIGS. 1a-1c and described above. In FIGS. 4a-4d and 5a-5d, voltage directions for the nanopillars are shown by respective arrows marked V+ and V− and stable magnetization directions are shown by arrows within the FM layers. It is noted that current will flow in a direction opposite to that of the arrows for the voltages.

Figure 4A:
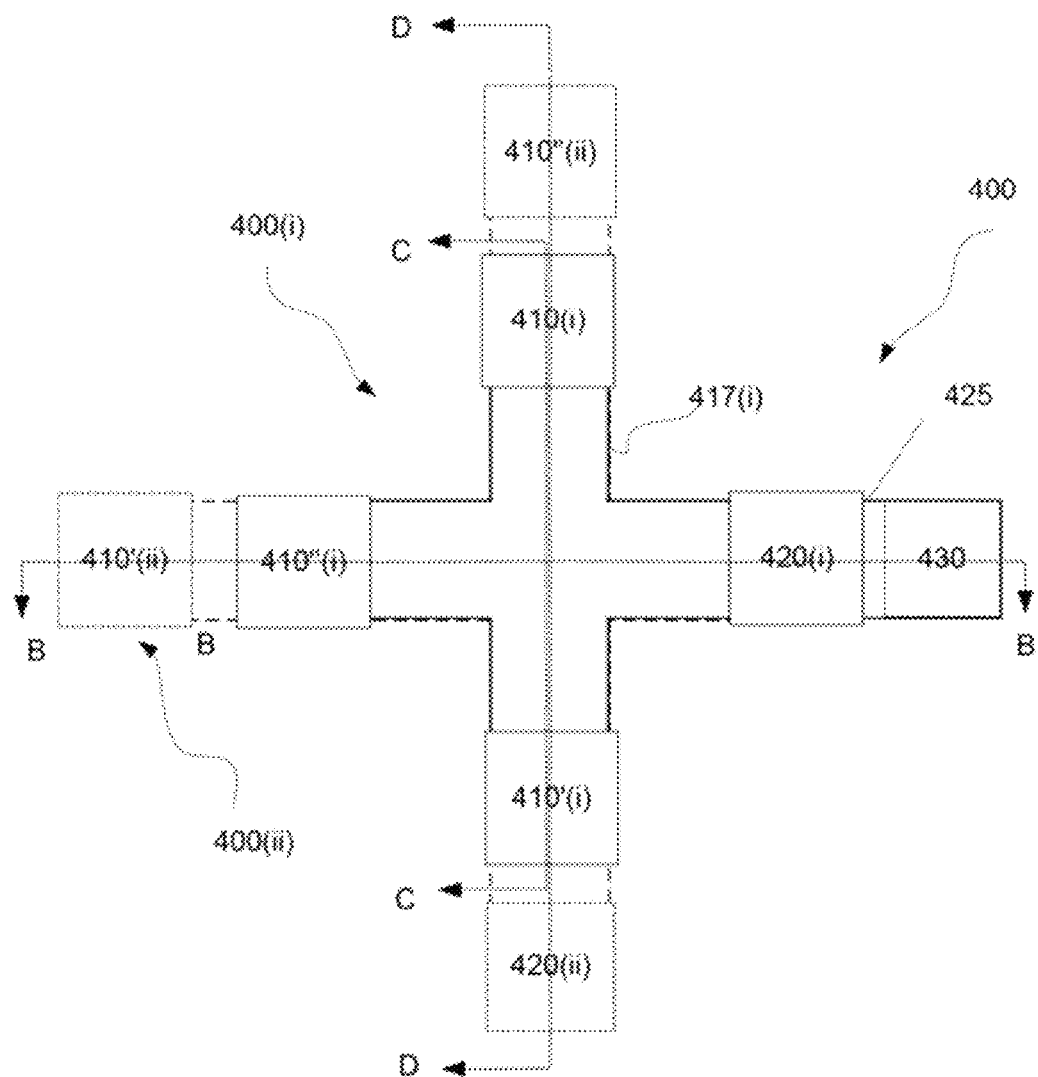
FIG. 4a is a top plan view similar to FIG. 1a of a first embodiment of a magnetization circuit.
Figure 4B:
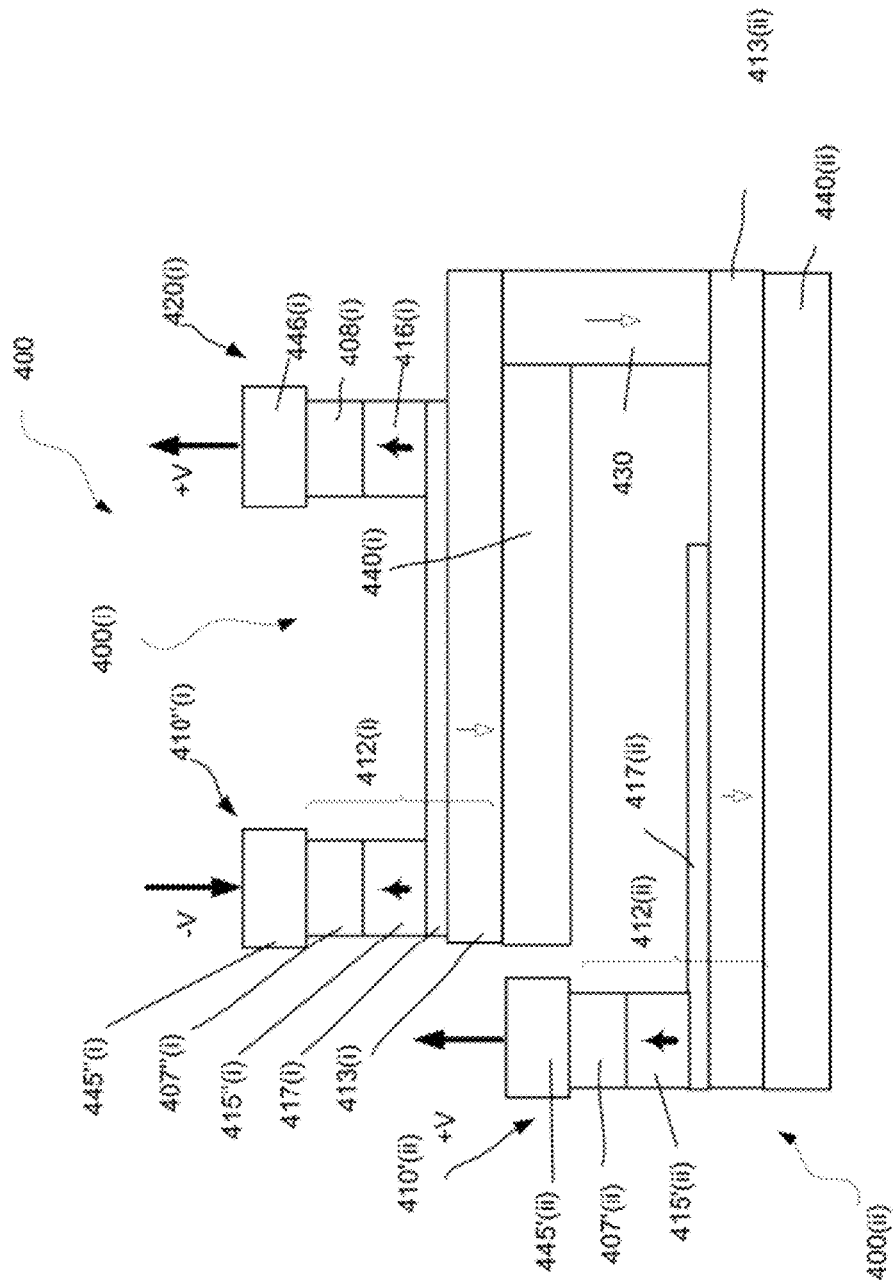
Figure 4C:
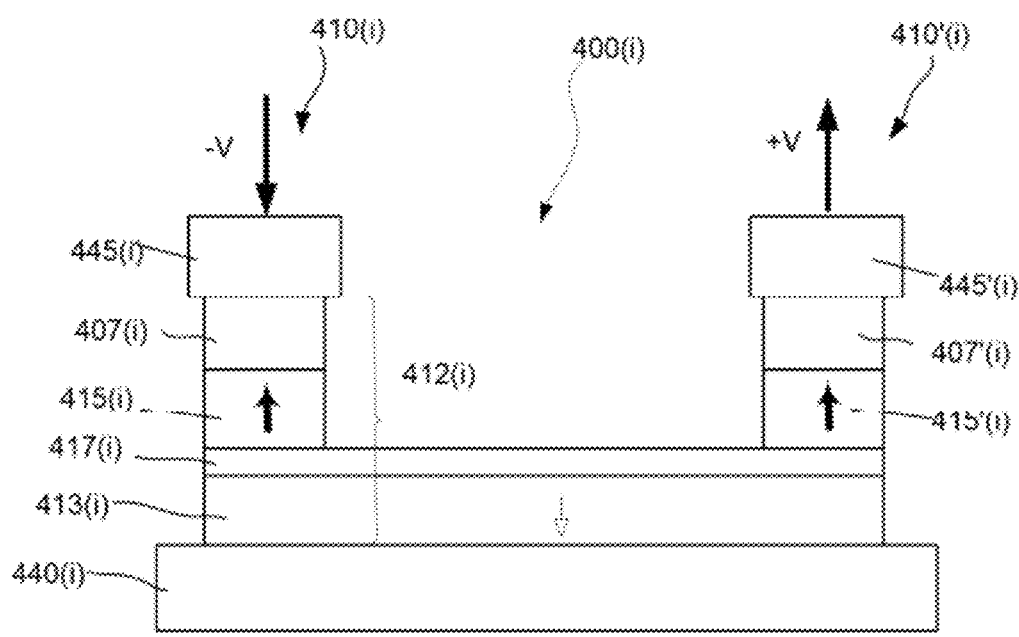

Referring first to FIGS. 4a-4d, a top plan view and cross-sectional views of a first embodiment of a circuit 400 of a microelectronic device are shown including two STMG devices with the insulation layers not being shown for the sake of simplicity. FIGS. 4b, 4c and 4d are cross sections of FIG. 4a along lines B-B, C-C and D-D, respectively, with FIG. 4c omitting the bottom spintronic device and FIG. 4d omitting the top spintronic device as will become apparent as the description progresses. In the shown embodiment, a first STMG device 400(i) is connected by way of a connector 430 (shown in broken lines in FIG. 4a to convey that it lies at a different metal level on circuit 400) to a second STMG device 400(ii) in a passive configuration as will be explained later. The STMG devices 400(i) and 400(ii) are similar to STMG device 100 of FIGS. 1a-1c described previously. Thus, like reference numerals as between FIGS. 1a-1c on the one hand, and FIGS. 4a-4d on the other hand, are meant to refer to like components for each STMG device, and will therefore not be described further. Thus, reference numerals 107, 107', 107", 108, 110, 110', 110", 112, 113, 115, 115', 115", 116, 117, 120, 140, 145, 145', 145", 146 refer to parts in FIGS. 1a-1b that are respectively structurally similar to parts in FIGS. 4a-4d referred to as 407(i), 407'(i), 407"(i), 408(i), 410(i), 410'(i), 410"(i), 412(i), 413(i), 415(i), 415'(i), 415"(i), 416(i), 417(i), 420(i), 440(i), 445(i), 445'(i), 445"(i) and 446(i) for STMG device 400(i). In addition, reference numerals 107, 107', 107", 108, 110', 110", 112, 113, 115, 115', 115", 116, 117, 120, 140, 145, 145', 145", 146 refer to parts in FIGS. 1a-1b that are respectively structurally similar to parts in FIGS. 4a-4d referred to as 407(ii), 407'(ii), 407"(ii), 408(ii), 410'(ii), 410"(ii), 412(ii), 413(ii), 415(ii), 415'(ii), 415"(ii), 416(ii), 417(ii), 420(ii), 440(ii), 445(ii), 445'(ii), 445"(ii) and 446(ii) for STMG device 400(ii). A structural difference between the STMG device of FIGS. 1a-1c on the one hand, and STMG device 400(ii) of FIGS. 4a-4d on the other hand, is the absence from STMG device 400(ii) of an input nanopillar at one of the ends of the cross-shaped common non-magnetic layer 413(ii). Connector 430 extends between STMG device 400(i) and STMG device 400(ii) as shown, STMG device 400(ii) being disposed at a different metal level on circuit 400 of the device as compared with STMG device 400(i). Thus, as shown, STMG device 400(i) may for example use as its electrodes metal lines or metallization layers corresponding to M3 and M4, while STMG device 400(ii) may for example use as its electrodes metal lines or metallization layers M2 and M3 as shown. As best seen in FIG. 4b, the magnetic connector 430 extends from common free FM layer 413(i) down to common free FM layer 413(ii) at a location corresponding to an absent input nanopillar of STMG device 400(ii) as shown. Connector 430 in this way is adapted to provide a magnetization output of the STMG device 400(i) to be used as a magnetization input to the STMG device 400(ii) as shown, in this passive configuration of the two concatenated STMG devices. It is noted that the embodiment of FIGS. 4a-4d advantageously not only minimizes wire length by not requiring an extension of a free FM layer as shown for example in the prior art configuration of FIGS. 2a-2b, but also disposes the second spintronic device directly below the first spintronic device, in this way allowing the fabrication of denser magnetic circuits.

Figure 5A:
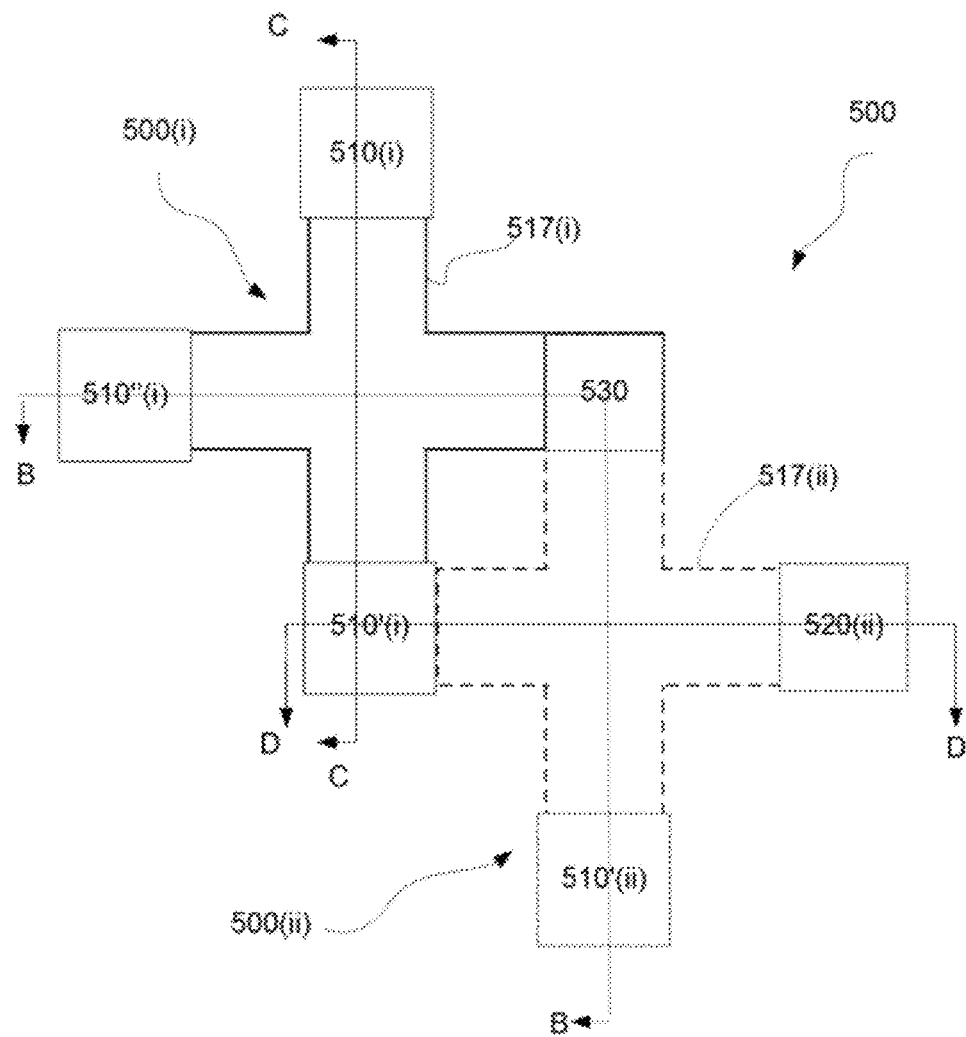
FIG. 5a is a top plan view similar to FIG. 1a of a second embodiment of a magnetization circuit.
Figure 5B:
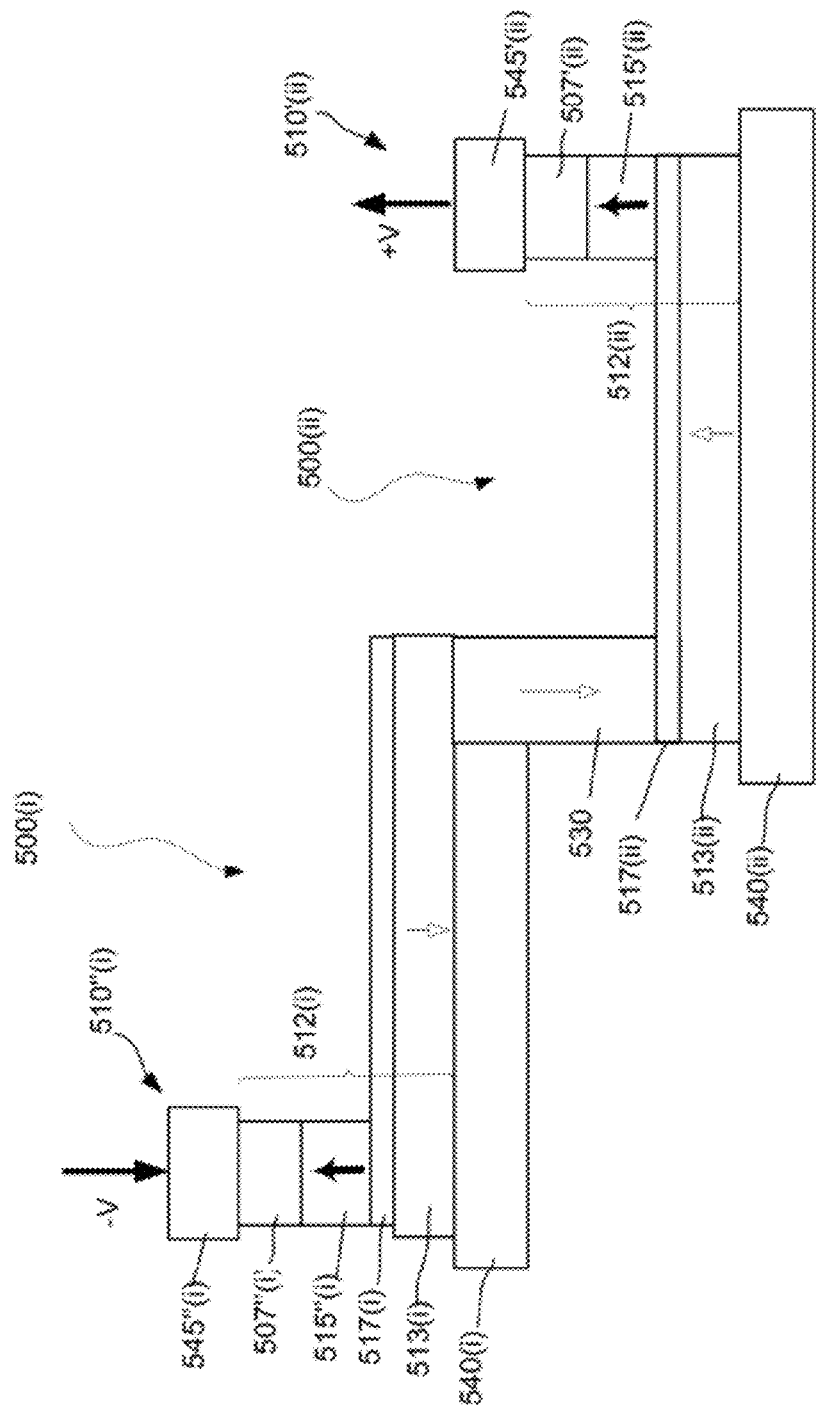
Figure 5C:
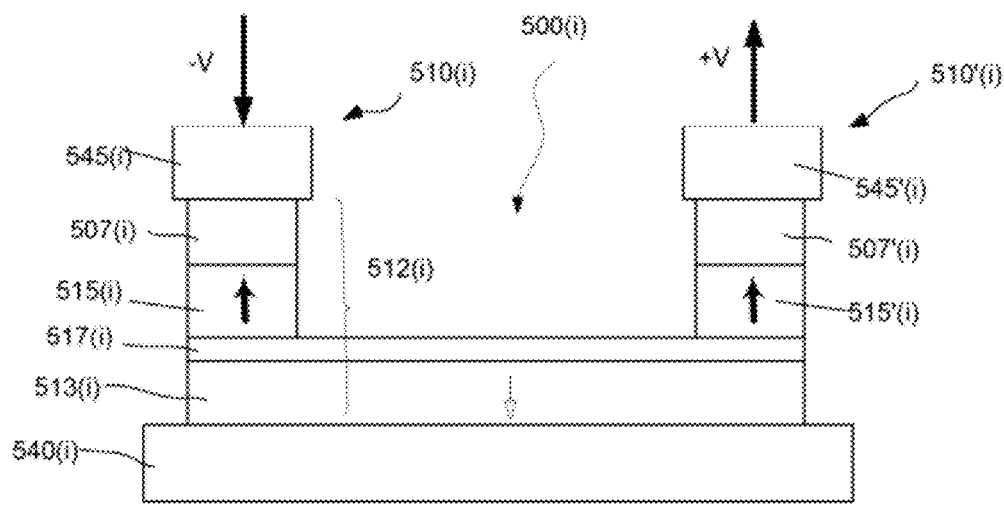
Figure 5D:
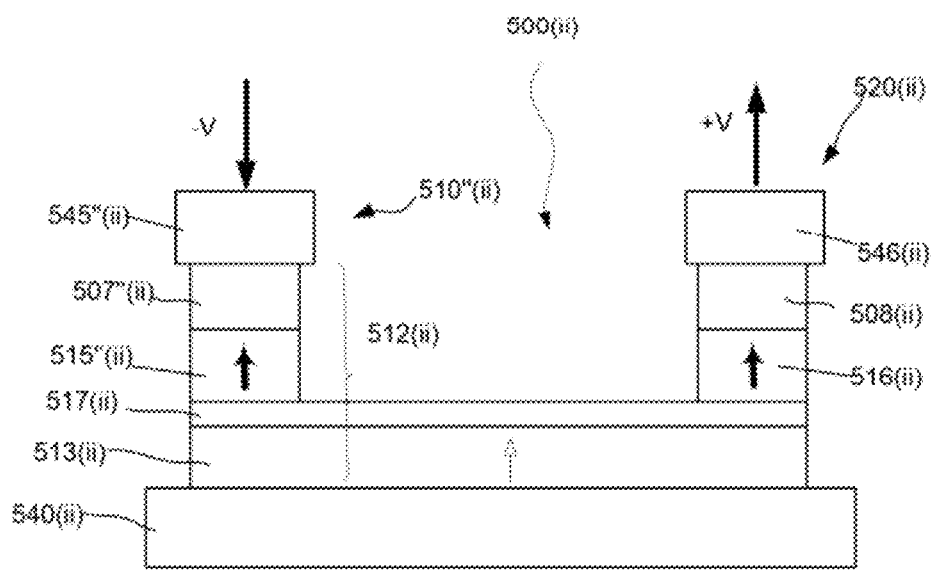

Referring next to a second embodiment as depicted in FIGS. 5a-5d, a top plan view and a cross-sectional view of a second embodiment of a circuit 500 of a microelectronic device are shown including two STMG devices with the insulating layers not being shown for the sake of simplicity. In the top plan view of FIG. 5a, the input nanopillar 510"(ii) is further hidden from view by input nanopillar 510'(i). FIGS. 5b, 5c and 5d are cross sections of FIG. 5a along lines B-B, C-C (for the lower STMG device only) and D-D respectively, with FIG. 5c omitting the bottom device and FIG. 5d omitting the top device as will become apparent as the instant description progresses. In the shown embodiment, a first STMG device 500(i) is connected by way of a connector 530 (shown in broken lines in FIG. 5a to convey that it lies at a different metal level on circuit 500) to a second STMG device 500(ii) in an active configuration as will be explained later. The STMG devices 510(i) and 510(ii) are similar to STMG device 100 of FIGS. 1a-1c described previously. Thus, like reference numerals as between FIGS. 1a-1c on the one hand, and FIGS. 5a-5d on the other hand, are meant to refer to like components for each STMG device, and will therefore not be described further. Thus, reference numerals 107, 107', 107", 108, 110, 110', 110", 112, 113, 115, 115', 115", 116, 117, 140, 145, 145', 145", 146 refer to parts in FIGS. 1a-1b that are respectively structurally similar to parts in FIGS. 5a-5d referred to as 507(i), 507'(i), 507"(i), 508(i), 510(i), 510'(i), 510"(i), 512(i), 513(i), 515(i), 515'(i), 515"(i), 516(i), 517(i), 540(i), 545(i), 545'(i), 545"(i) and 546(i) for STMG device 500(i). In addition, reference numerals 107, 107', 107", 108, 110', 110", 112, 113, 115, 115', 115", 116, 117, 120, 140, 145, 145', 145", 146 refer to parts in FIGS. 1a-1b that are respectively structurally similar to parts in FIGS. 5a-5d referred to as 507(ii), 507'(ii), 507"(ii), 508(ii), 510'(ii), 510"(ii), 512(ii), 513(ii), 515(ii), 515'(ii), 515"(ii), 516(ii), 517(ii), 520(ii), 540(ii), 545(ii), 545'(ii), 545"(ii) and 546(ii) for STMG device 500(ii). A structural difference between the STMG device 100 of FIGS. 1a-1c on the one hand, and STMG device 500(i) of FIGS. 5a-5d on the other hand, is the absence from STMG device 500(i) of an output nanopillar at one of the ends of the cross-shaped common non-magnetic layer 513(ii). A structural difference between the STMG device 100 of FIGS. 1a-1c on the one hand, and STMG device 500(ii) of FIGS. 5a-5d on the other hand, is the absence from STMG device 500(ii) of an input nanopillar at one of the ends of the cross-shaped common non-magnetic layer 513(ii) (similar to STMG device 400(ii) of FIGS. 4a-4d. Connector 530 extends between STMG device 500(i) and STMG device 500(ii) from a location of a missing output nanopillar on STMG device 500(i) to a location of a missing input nanopillar on STMG device 500(ii), STMG device 500(ii) being disposed at a different metal level on circuit 500 of the device as compared with STMG device 500(i). Thus, as shown, STMG device 500(i) may for example use as its electrodes metal lines or metallization layers corresponding to M3 and M4, while STMG device 500(ii) may for example use as its electrodes metal lines or metallization layers M2 and M3 as shown. As best seen in FIG. 5b, the magnetic connector 530 extends from common free FM layer 513(i) down to non-magnetic layer 517(ii). Connector 530 in this way is adapted to provide not only a magnetization output of the STMG device 500(i) to be used as a magnetization input to the STMG device 500(ii) (similar to FIGS. 4a-4d), but also to pass current through it as an output of the STMG device 500(i) to switch magnetization of the common free layer 513(ii) of STMG device 500(ii), the magnetic connector 530 in this way additionally serving as a fixed layer in a nanopillar (made up of the connector itself) of the STMG device 500(*ii*), in this active configuration of the concatenated STMG devices.

In the above-described embodiments, the shown device has nanopillars with square-shaped cross-sections. In practice, the square-shaped cross-sections may be rounded at their corners by virtue of lithography constraints as would be recognized by a person skilled in the art. However, STMG devices used in embodiments could exist that have nanopillars with other cross-sectional configurations, such as, for example, ellipses or circles. In addition, as previously mentioned, embodiments are by no means limited to a STMG, or even to the use of spin logic devices, but rather include within their scope the use of a connector to connect any two or more spintronic devices, whether spin logic devices, spin memory devices or spin oscillators by way of example. In addition, the particular embodiments described represent devices with perpendicular magnetization of the free FM layers, although embodiments are not so limited, and include within their scope the use of any configuration of a spintronic device as would be recognized by a skilled person. Furthermore, although embodiments are described as being disposed between successive metal lines or metallization layers of a microelectronic device, embodiments are not so limited, and include within their scope the provision of spintronic devices connected by a magnetic connector that spans across more than one metal line.

Referring now to FIGS. 6a-6f, an operation of a magnetic connector was verified using simulation, in particular using a simulation based on the Object Oriented Micromagnetic Framework (OOMMF) modeling program from NIST. OOMMF refers generally to a project in the Mathematical and Computational Sciences Division (MCSD) of the Information Technology Laboratory (ITL) and the National Institute of Standards and Technology (NIST) in cooperation with the Micromagnetic Modeling Activity Group (pMAG), aimed at developing portable, extensible public domain programs and tools for micromagnetics.

FIGS. 6a-6f show successive snapshots for switching magnetization in a magnetic connector, similar for example to connectors 430 FIGS. 4a-4d, where the respective spintronic devices are concatenated in a passive configuration. Thus, as seen in FIG. 6a, a connector 630 conducts magnetization from the common free FM layer 613(*i*) of a first spin logic device to the common free FM layer 613(*ii*) of a second spin logic device. The simulation shows: (a) the initial magnetization state of the connector with magnetization pointing up over the whole connector as shown by the upward pointing arrows, (b) spin torque from current entering at the top left contact and passing through the connector, driving the direction of magnetization to point down; and (c) downward magnetization setting in at the bottom left wire. In the simulation (see FIG. 6a), the connector height h was about 30 nm, the connector width was about 30 nm (for a square-shaped cross-section), the top and bottom wires (common free FM layers) had a thickness t of about 5 nm, noting that the top and bottom layers in the simulation were of course extending at ends thereof beyond the constraints shown on the drawing page. The applied current was 5 mA applied at the top left of the wire, and sample images were taken at time instants separated by 0.2 ns.

Figure 7:
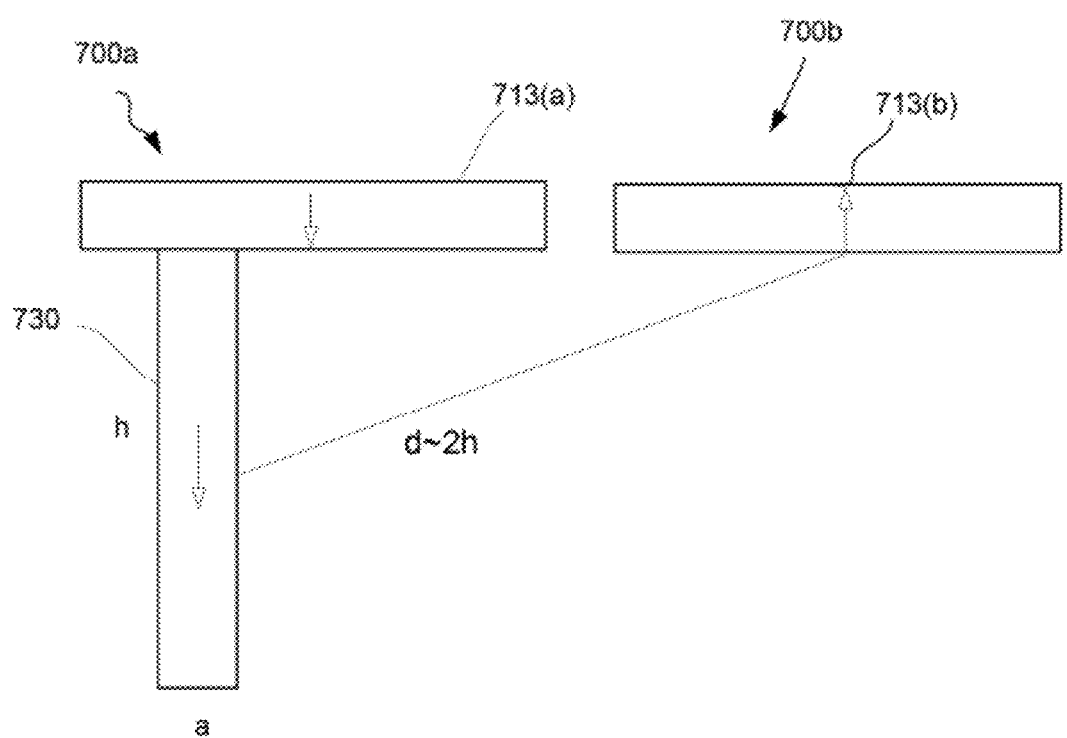
FIG. 7 is a cross-sectional view of a magnetic connector and a common free FM layer attached thereto depicting a minimum allowable distance as between adjacent magnetic circuit lines.

Referring next to FIG. 7, an important necessary condition for the operation of a device as described above is that magnetic crosstalk between connectors and planar wires does not disturb their operation. FIG. 7 depicts two adjacent magnetic circuits in a typical arrangement with typical measurements according to an embodiment. FIG. 7 thus depicts a first spintronic device 700a of a first magnetic circuit, only a portion of which is shown, having a magnetic connector 730 with a height h, a thickness a, the magnetic connector being attached at one end thereof of a common free FM layer 713(*a*), and being disposed near a second spintronic device 700b of a second magnetic circuit, only a free common FM layer 713b of which is shown. It has been found that minimum distance d between a center of connector 730 and center of metal line 713(*b*) that would be allowed to avoid cross talk could be twice a height of the magnetic connector. A maximum value of stray magnetic field H between the two dipole moments (as defined by the center points noted above) using a connector 730 having a height h of about 100 nm, a width a of about 10 nm, with a saturation magnetization $M_s$ of about $10^6$ A/m and a d of about 2 times h using Equation (1) below:

$$H \approx (M_s a^2 h)/d^3 \sim (M_s a^2)/4h^2 \qquad \text{Eq. (1)}$$

yields an H value of about $2.5 \times 10^3$ A/m or about 30 Oe. A conclusion from the estimate above is that stray fields are in the order of about 30 Oe, while it has been found that the coercive field, that is, the threshold for disturbing magnetization is of the order of 100 Oe. Therefore, cross-talk by virtue of the magnetic connector may be insignificant for the d value noted above.

Figure 8:
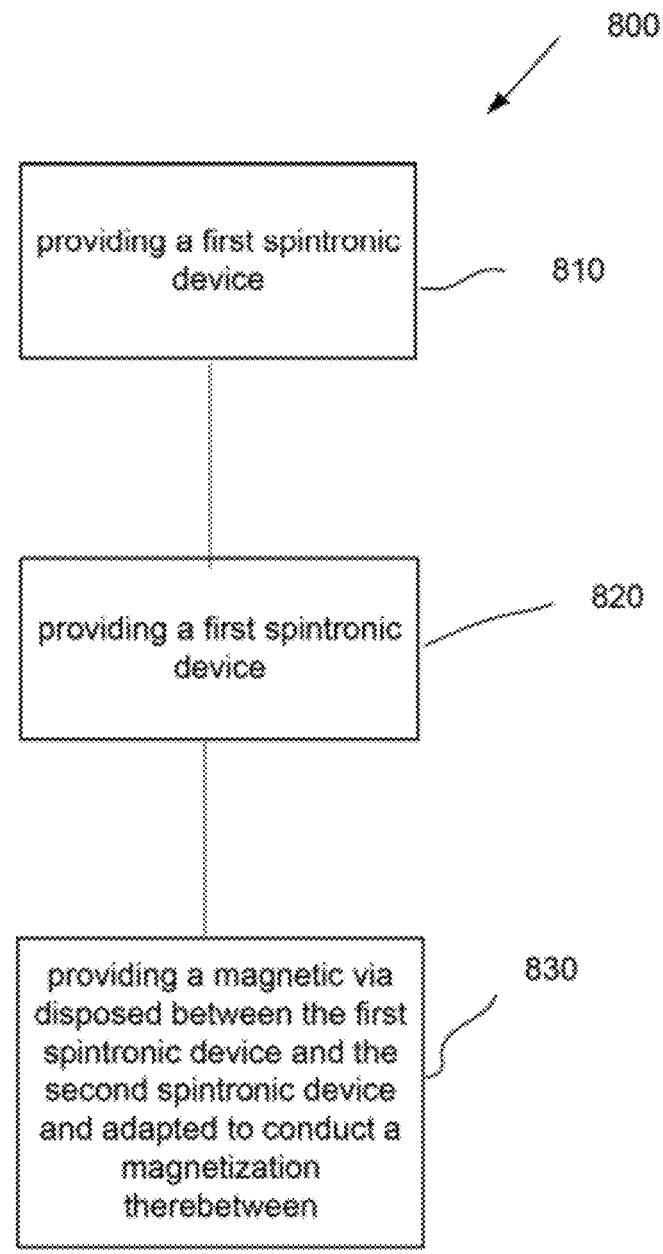
FIG. 8 is a flowchart showing a method according to embodiments.

Referring next to FIG. 8, a method embodiment is depicted in flowchart format. A method embodiment 600 at block 810 includes providing a first spintronic device, and at block 820 includes providing a second spintronic device. At block 830, a method embodiment includes providing a magnetic connector disposed between the first spintronic device and the second spintronic device and adapted to conduct a magnetization therebetween.

Figure 9:
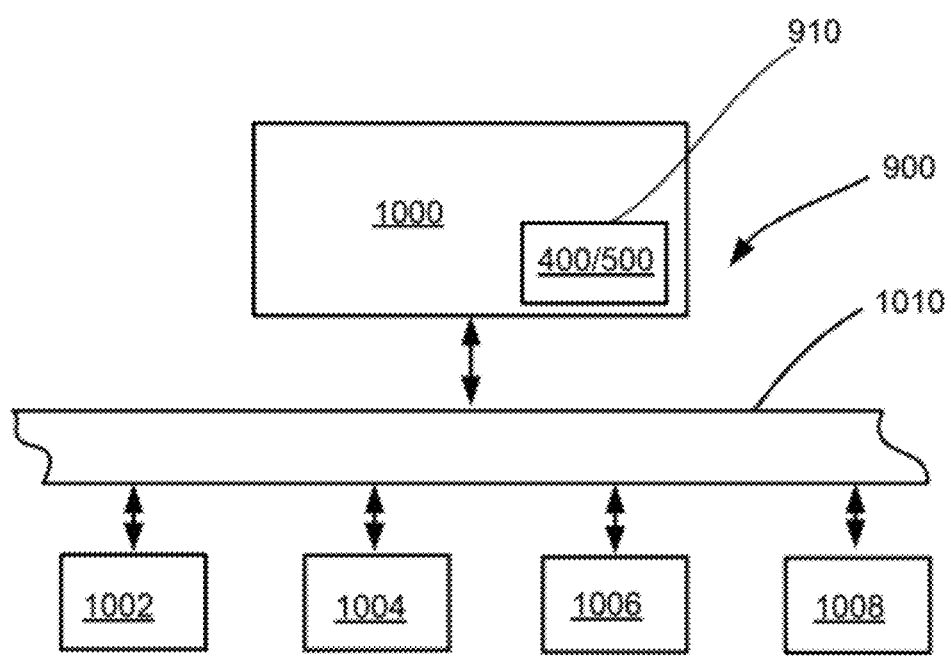
FIG. 9 is a system incorporating a spintronic device according to embodiments.

Referring to FIG. 9, there is illustrated one of many possible systems 900 in which embodiments of the present invention may be used. In one embodiment, the electronic arrangement 1000 may include an integrated circuit 910 including a circuit such as the circuits 400 or 500 shown in FIGS. 4a-4d or 5a-5d, respectively. Arrangement 1000 may further include a microprocessor, a transceiver chip, or a sensor chip. In an alternate embodiment, the electronic arrangement 1000 may include an application specific IC (ASIC). Integrated circuits found in chipsets (e.g., graphics, sound, and control chipsets) may also be packaged in accordance with embodiments of this invention.

For the embodiment depicted by FIG. 9, the system 900 may also include a main memory 1002, a graphics processor 1004, a mass storage device 1006, and/or an input/output module 1008 coupled to each other by way of a bus 1010, as shown. Examples of the memory 1002 include but are not limited to static random access memory (SRAM) and dynamic random access memory (DRAM). Examples of the mass storage device 1006 include but are not limited to a hard disk drive, a compact disk drive (CD), a digital versatile disk drive (DVD), and so forth. Examples of the input/output module 1008 include but are not limited to a keyboard, cursor control arrangements, a display, a network interface, and so forth. Examples of the bus 1010 include but are not limited to a peripheral control interface (PCI) bus, and Industry Standard Architecture (USA) bus, and so forth. In various embodiments, the system 90 may be a wireless mobile phone, a personal digital assistant, a pocket PC, a tablet PC, a notebook PC, a desktop computer, a set-top box, a media-center PC, a DVD player, and a server.

Advantageously, according to embodiments, magnetic logic circuits may be formed in several layers on a chip, and the magnetization direction and sometimes current may be transferred from one layer to another layer by way of a magnetic connector. To achieve the above, fixed FM layers and common free FM layers may be separated by a tunneling barrier. Input pillars to conduct current and to change magnetization connector a spin transfer torque effect may thus be created. Such circuits may be formed in different layers of metallization of a device. The ends of such connectors may serve as input to circuits or as fixed FM layers. Embodiments allow an increase in the density of logic circuits on chip without decreasing the minimal feature size, and further allow the provision of non-volatile logic circuits using different layers of spintronic devices. Thus, a three-dimensional integration of circuits may be achieved with connections between various layers, allowing the possibility of exploring a wealth of architectures, such as, for example, three-dimensional cellular nonlinear networks.

Prior art devices based on CMOS would involve stacking multiple wafers each including CMOS logic devices on a device layer of a semiconductor substrate, the stacking allowing one to achieve a three-dimensional integration of logic devices. However, wafer bonding is expensive, involves only a limited opportunity for stacking, and in addition appreciably extends the length of wires, in this way tending to have deleterious effects on device performance. Prior art devices including spintronic devices further allow a lateral magnetic coupling of devices from one spintronic device to another spintronic device by extending a free FM layer of one device to serve as a free FM layer of another device. However, such a lateral extension of the free FM layer is still not optimal in terms of wire length minimization, as compared with embodiments, for example as depicted in FIGS. 4a-4d and 5a-5d, where the provision of a connector between successive metal lines allow a further optimization of wire length, since it shortens the length of wire necessary to concatenate two spintronic devices (thus allowing the free FM layer of the first spintronic device to be as short as possible by placing the spintronic devices as short a distance as possible from one another). To the extent that, especially for magnetic circuits, propagation delay is even more dependent on wire length, a minimization of wire length such as the one brought about by embodiments becomes even more significant, in particular when a large number of spintronic devices are integrated as they usually are in a given circuit. In addition, the embodiment of FIGS. 4a-4d advantageously highlights the possibility of minimizing space as between connected spintronic devices even further, by placing the second spintronic device 400(ii) directly below the first spintronic device 400(i) as shown.

The foregoing description is intended to be illustrative and not limiting. Variations will occur to those of skill in the art. Those variations are intended to be included in the various embodiments of the invention, which are limited only by the scope of the following claims.

What is claimed is:

1. A circuit including:
   a first spintronic device having a first common free FM layer;
   a second spintronic device having a second common free FM layer;
   a magnetic connector connected at one end thereof to the first common free FM layer and at another end thereof to the second common free FM layer to conduct a magnetization output of the first spintronic device to the second spintronic device from the first common free FM layer to the second common free FM layer.

2. The circuit of claim 1, wherein the first spintronic device has a first magnetization stack and the second spintronic device has a second magnetization stack, and wherein the magnetic connector extends between respective magnetization stacks of the first spintronic device and the second spintronic device.

3. The circuit of claim 2, wherein the circuit includes an integrated circuit comprising:
   a substrate; and
   a plurality of metallization layers on the substrate;
   wherein:
      the first spintronic device includes a first two of the plurality of metallization layers;
      the first magnetization stack is disposed between the first two of the plurality of metallization layers;
      the second spintronic device includes a second two of the plurality of metallization layers; and
      the second magnetization stack is disposed between the second two of the plurality of metallization layers.

4. The circuit of claim 3, wherein each of the first magnetization stack and second magnetization stack includes:
   a common free FM layer;
   a common non-magnetization layer over the common free FM layer;
   a plurality of nanopillars on the common non-magnetization layer, each of the nanopillars including:
      a fixed FM layer disposed on the common non-magnetization layer; and
      a pinning layer disposed on the fixed FM layer.

5. The circuit of claim 4, wherein:
   some of the plurality of nanopillars include input nanopillars; and
   at least one of the first magnetization stack and the second magnetization stack further includes an output nanopillar;
   the magnetic connector extends from the first spintronic device to the second spintronic device at a location closest to one of the input nanopillars.

6. The circuit of claim 5, wherein:
   the first magnetization stack includes a first output nanopillar;
   the second magnetization stack includes a second output nanopillar; and
   the magnetic connector extends from the first spintronic device at a location closest to the first output nanopillar to the second spintronic device at a location closest to one of the input nanopillars of the second spintronic device.

7. A method of making a circuit comprising:
   providing a first spintronic device having a first common free FM layer;
   providing a second spintronic device having a second common free FM layer;
   providing a magnetic connector connected at one end thereof to the first common free FM layer and at another end thereof to the second common free FM layer to conduct a magnetization output of the first spintronic device to the second spintronic device from the first common free FM layer to the second common free FM layer.

8. The method of claim 7, wherein the first spintronic device has a first magnetization stack and the second spintronic device has a second magnetization stack, and wherein the magnetic connector extends between respective magnetization stacks of the first spintronic device and the second spintronic device.

9. The method of claim 8, wherein the circuit includes an integrated circuit comprising:
   a substrate; and
   a plurality of metallization layers on the substrate; and wherein:
the first spintronic device includes a first two of the plurality of metallization layers;
the first magnetization stack is disposed between the first two of the plurality of metallization layers;
the second spintronic device includes a second two of the plurality of metallization layers; and
the second magnetization stack is disposed between the second two of the plurality of metallization layers.

10. The method of claim 9, wherein each of the first magnetization stack and second magnetization stack includes:
a common free FM layer;
a common non-magnetization layer over the common free FM layer;
a plurality of nanopillars on the common non-magnetization layer, each of the nanopillars including:
a fixed FM layer disposed on the common non-magnetization layer; and
a pinning layer disposed on the fixed FM layer.

11. The method of claim 10, wherein:
some of the plurality of nanopillars include input nanopillars; and
at least one of the first magnetization stack and the second magnetization stack further includes an output nanopillar;
the magnetic connector extends from the first spintronic device to the second spintronic device at a location closest to one of the input nanopillars.

12. The method of claim 11, wherein:
the first magnetization stack includes a first output nanopillar;
the second magnetization stack includes a second output nanopillar; and
the magnetic connector extends from the first spintronic device at a location closest to the first output nanopillar to the second spintronic device at a location closest to one of the input nanopillars of the second spintronic device.

13. A system comprising,
an integrated circuit including a circuit having:
a first spintronic device having a first common free FM layer;
a second spintronic device having a second common free FM layer;
a magnetic connector is connected at one end thereof to the first common free FM layer and at another end thereof to the second common free FM layer to conduct a magnetization output of the first spintronic device to the second spintronic device from the first common free FM layer to the second common free FM layer;
a graphics processor coupled to the integrated circuit.

14. The system of claim 13, wherein the first spintronic device has a first magnetization stack and the second spintronic device has a second magnetization stack, and wherein the magnetic connector extends between respective magnetization stacks of the first spintronic device and the second spintronic device.

15. The system of claim 14, wherein the integrated circuit includes:
a substrate; and
a plurality of metallization layers on the substrate; and
wherein:
the first spintronic device includes a first two of the plurality of metallization layers;
the first magnetization stack is disposed between the first two of the plurality of metallization layers;
the second spintronic device includes a second two of the plurality of metallization layers; and
the second magnetization stack is disposed between the second two of the plurality of metallization layers.

16. The system of claim 15, wherein each of the first magnetization stack and second magnetization stack includes:
a common free FM layer;
a common non-magnetization layer over the common free FM layer;
a plurality of nanopillars on the common non-magnetization layer, each of the nanopillars including:
a fixed FM layer disposed on the common non-magnetization layer; and
a pinning layer disposed on the fixed FM layer.

17. The system of claim 16, wherein:
some of the plurality of nanopillars include input nanopillars; and
at least one of the first magnetization stack and the second magnetization stack further includes an output nanopillar;
the magnetic connector extends from the first spintronic device to the second spintronic device at a location closest to one of the input nanopillars.

18. The system of claim 17, wherein:
the first magnetization stack includes a first output nanopillar;
the second magnetization stack includes a second output nanopillar; and
the magnetic connector extends from the first spintronic device at a location closest to the first output nanopillar to the second spintronic device at a location closest to one of the input nanopillars of the second spintronic device.

* * * * *